(12) United States Patent
Söderlund

(10) Patent No.: US 6,837,785 B2
(45) Date of Patent: Jan. 4, 2005

(54) CHECK VALVE, FAN UNIT, AND FORCED AIR COOLING SYSTEM

(75) Inventor: Per Thomas Söderlund, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/475,577

(22) PCT Filed: Apr. 27, 2001

(86) PCT No.: PCT/SE01/00929

§ 371 (c)(1),
(2), (4) Date: Oct. 23, 2003

(87) PCT Pub. No.: WO02/089549

PCT Pub. Date: Nov. 7, 2002

(65) Prior Publication Data

US 2004/0129410 A1 Jul. 8, 2004

(51) Int. Cl.[7] .................................................. H05K 5/00
(52) U.S. Cl. ...................................... 454/184; 361/695
(58) Field of Search ............................... 454/184, 259, 454/353; 361/695

(56) References Cited

U.S. PATENT DOCUMENTS

| | | | | |
|---|---|---|---|---|
| 5,793,610 A | * | 8/1998 | Schmitt et al. | 361/695 |
| 5,921,862 A | * | 7/1999 | Ucciardi | 454/353 |
| 6,005,770 A | * | 12/1999 | Schmitt | 361/695 |
| 6,042,348 A | * | 3/2000 | Aakalu et al. | 361/695 |
| 6,115,250 A | * | 9/2000 | Schmitt | 361/695 |
| 6,181,557 B1 | * | 1/2001 | Gatti | 361/695 |

* cited by examiner

Primary Examiner—Jiping Lu

(57) ABSTRACT

A backflow preventing check valve for use in a fan unit in a forced air cooling system includes a generally rectangular frame, a plurality of adjacent parallel pivot axes mounted in the frame, and a plurality of adjacent vanes that pivot around the axes between open and closed positions. The axes extend generally transverse to the direction of fluid flow through the valve, and each axis is offset from the center of gravity of its associated vane so that fluid flowing through the valve in an allowed direction moves the vanes toward the open position, and fluid flowing in a blocked direction moves the vanes toward the closed position. The axes are inclined at an angle ($\alpha$) measured from a vertical reference, thereby causing the vanes to be urged by gravity to pivot towards the closed position.

27 Claims, 12 Drawing Sheets

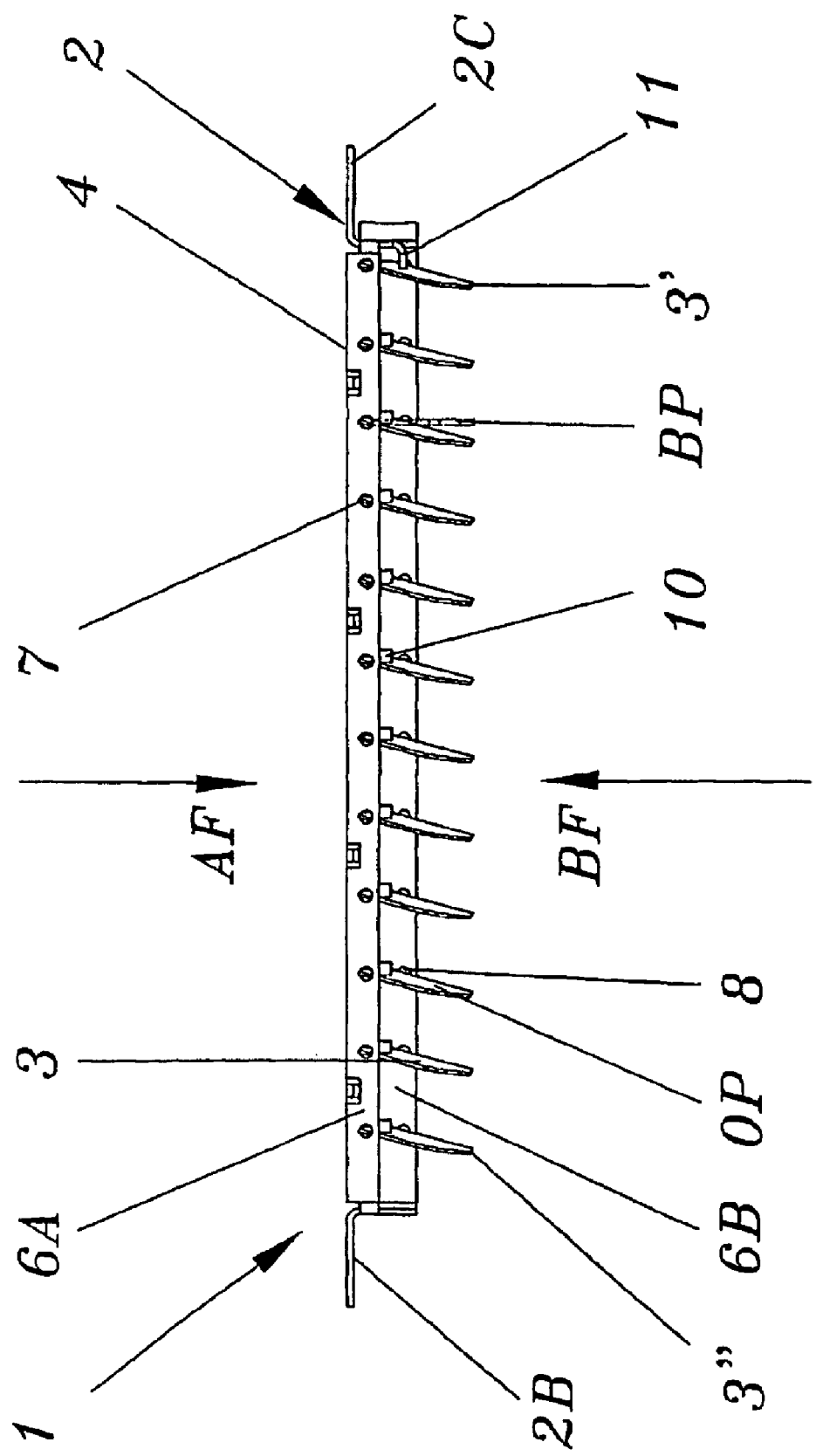

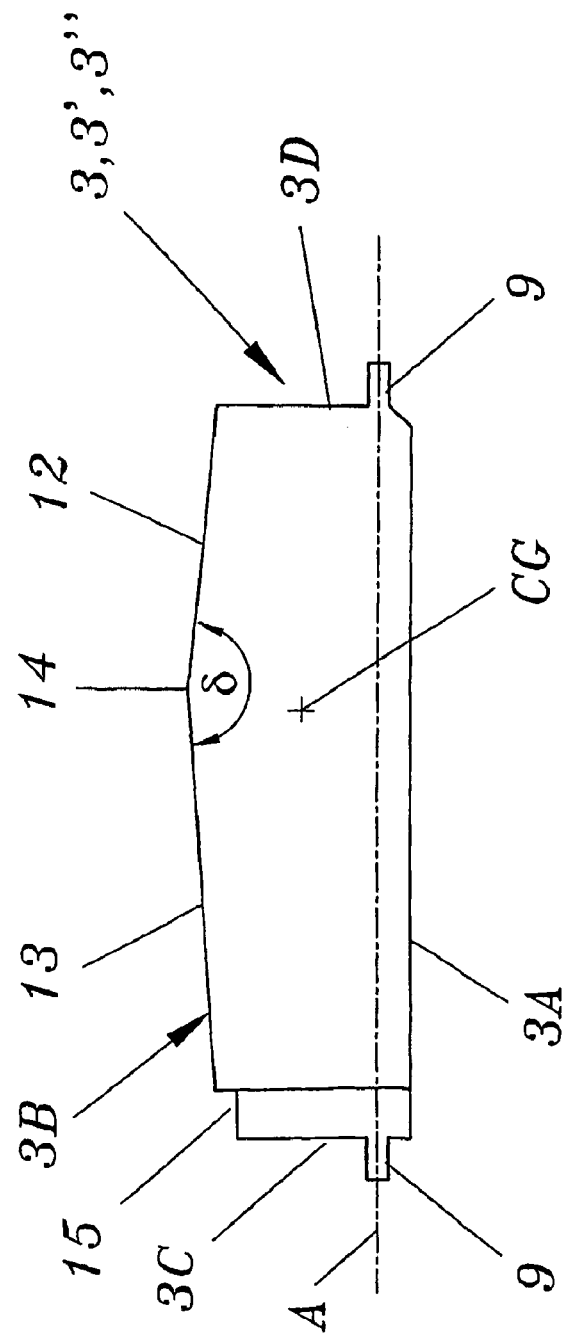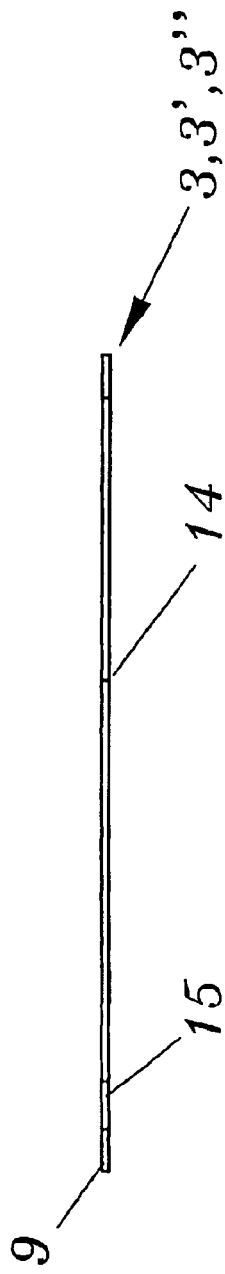
FIG. 4A
FIG. 4B

CHECK VALVE, FAN UNIT, AND FORCED AIR COOLING SYSTEM

TECHNICAL FIELD

The present invention relates generally to devices that are employed for allowing full or regulated fluid flow in one specified direction when in their open condition and for preventing fluid flow in the opposite direction when in their closed condition, such devices being generally referred to as check valves.

BACKGROUND

Check valves are very common in various applications for controlling the flow of gaseous or liquid fluids in the above described manner. With regard to the operation of the valves between their fully or partly open and closed conditions, such check valves are normally of one of three major types. Specifically, the check valves may be operated between their different positions by a control means acting directly or indirectly upon a valve member for regulating the flow through the valve. This type of valve also includes manual operation of the control means or the valve member. It is mostly used in pneumatic and hydraulic fluid systems requiring a relatively sophisticated control of the fluid flow, for providing a regulated flow in one direction and/or a fluid tight seal against flow in the other direction. This type of valve is therefore comparatively expensive and not suitable for use in applications requiring only a simple inexpensive device for preventing back-flow.

A second major type of check valve is provided with a separate biasing means, normally in the shape of a spring, constantly urging the valve/valve member(-s) towards the closed condition. In other words, the valve member or members is/are maintained in the open position by the flowing fluid, against the biasing force, and is/are automatically closed once the fluid flow stops. This type of valve is normally only operated between a fully open and a fully closed condition. Since the biasing force has to be overcome by the flowing fluid, a relatively large pressure drop is created across the valve. This general type of valve is disclosed i.a. in U.S. Pat. No. 6,011,689, where a cooling system for a computer has redundant cooling air fans employing back-flow preventing vents having hinged vanes that are pivotal about vertical axes. In order to secure closing of the respective vent in the event that the associated fan fails, each of the pivotal vanes are provided with a spring urging the vane towards the closed position. The vanes are caused to pivot to the open position by the fan airflow, overcoming the biasing force. Thereby, the vanes offer considerable resistance to said airflow and cause a pressure drop across the back-flow preventing valve.

The third major type of check valve is similar to the second type, the main difference being that the valve has no separate biasing means. Instead, the force of gravity is employed for automatically urging the valve/valve member (-s) to the closed condition in the absence of fluid flow. This type of valve normally comprises a number of parallel vanes or louvers that are pivotal about a horizontal axis. The vanes are normally arranged so that adjacent vanes partly overlap each other in the closed position. With such a configuration, the pressure drop across the valve will still be noticeable since the force of gravity has to be overcome by the fluid flow. Attempts have been made to reduce the resulting pressure drop by lowering the weight of the individual vanes or alternatively by designing the vanes so that they provide less resistance to the airflow. Even with such attempts, the blades still cause a pressure drop that may be unacceptable in certain applications. Lowering the weight of the blades may also cause vibration and resulting noise and a special design for the blades will inevitably lead to an increased cost for manufacturing the valves. Examples of such valves are disclosed in i.a. U.S. Pat. Nos. 6,181,557B1 and 6,000,623.

The two latter types of "check valves" have lately been frequently used in applications relating to the cooling of electronic equipment. In such applications, not least within the telecommunication field, where electronic equipment is normally provided in an enclosure, such as a cabinet, the heat generated by the equipment has to be removed in an efficient manner in order to maintain proper operation of the equipment. This is accomplished by employing one or several fans configured to have a capacity for providing an adequate cooling airflow. In order to secure such an adequate airflow at all times it has become common practice to provide cooling systems employing parallel redundant fans. In other words, at least one backup-fan is provided to secure adequate temporary cooling even in the event that one fan fails. In such applications, it is highly desirable to employ a one way valve for each fan, normally provided immediately at the fan outlet, so that back-flow through a disabled fan may be prevented. Such back-flow may otherwise jeopardize the effect of the entire cooling system for the equipment. The above mentioned Patents are all specifically directed to valves for such applications.

U.S. Pat. No. 6,042,348 discloses a variant of a back-flow preventing valve for use in a forced air cooling system for electronic equipment. Said valve is provided with vertically arranged pivotal vanes. The vanes are not intended to close under the force of gravity or by any external means but entirely by the pressure differential that will be caused by the failure of the associated fan. In order to secure prompt closing of the valve in case of fan failure, such a design requires that in their fully open position the vanes form a relatively large angle with the direction of flow through the valve. Otherwise, the existing differential pressure may not be sufficient to securely close the valve. Therefore, the vanes will also in this case inevitably cause an undesirable pressure drop across the valve.

The above discussed pressure drop caused by the back flow preventing valve may be critical in many applications, such as in cabinets accommodating electronic equipment, where said pressure drop may have the effect that more powerful fans are required in order to provide adequate cooling. In many instances, the cabinets are of a standard size and the restricted space within the cabinets does not permit that the fans are upgraded in capacity.

Accordingly, there is a need within this art for a redundant fan cooling system having reliable valve means associated with each of the fans for preventing back-flow of air through the disabled fan and offering a very small resistance to the cooling air flowing through the valve in the open position thereof.

SUMMARY

The invention overcomes the above problems in an efficient and satisfactory manner.

A general object of the invention is to provide a solution to the problem of minimizing the flow resistance of an air cooling system. In particular, it is an object of the invention to reduce the resistance to the cooling air flow that is caused by a back-flow preventing valve, when in its open condition, and to simultaneously maintain reliable and efficient operation of the valve. The valve is of the general type comprising vanes that are pivotal about parallel axes between an open position allowing flow in one direction through the valve, and a closed position at least essentially obstructing flow in the opposite direction.

Briefly, the above object is achieved by arranging the vanes so that in said open position they are essentially balanced with regard to the force of gravity and present a small resistance to fluid flow through the valve. Leaving said open position the vanes are increasingly urged towards their closed position, blocking back-flow through the valve, by the force of gravity. Specifically, this is accomplished by inclining the pivot axes of the vanes against the general direction of flow through the valve. Accordingly, the invention provides a simple and inexpensive back-flow preventing valve that does not significantly impede the airflow, neither with regard to the pressure drop caused by the valve nor with regard to an undesirable deflection of said airflow. In the event of fan failure, the valve is securely closed under the increasing influence of the force of gravity.

In an embodiment of the invention, stop means are provided for each vane, to secure that the vanes do not pivot past the balanced position. With said stops a defined open position is established for each vane to thereby also eliminate any tendency of the vanes to oscillate or vibrate during fluid flow through the valve.

In a further embodiment, the stops are positioned so that the open positions of all of the vanes are defined shortly before the balanced position. In the event of fan failure, all of the vanes will therefore be securely pivoted toward their closed position under the increasing influence of the force of gravity.

The vanes of the valve may be associated with stops positioned so that all of the vanes will be essentially parallel in their open positions. However, in an alternative embodiment the stop for a first vane is positioned further from the balanced position than the stops for the remaining vanes. Expressed otherwise, the first vane in its open position forms a larger angle with the general direction of fluid flow through the valve, than the remaining valves. Accordingly, said first vane will close first in the event of fan failure, and will during its closing movement engage the adjacent vane and create what may be referred to as a "domino-effect" securing a distinct closing action.

In another embodiment the "domino-effect" may be optimized for secure closing of the valve. This is achieved by arranging the stops for the vanes so that in their open positions the successive vanes form smaller and smaller angles with the direction of flow. In other words the first vane forms the largest angle and the last vane forms the smallest angle.

In yet another embodiment the "domino-effect" may be employed to even further reduce air-flow impedance. This is accomplished by defining the open position for the first vane before the balanced position, that is with the first vane forming an angle with the direction of flow, whereas the open position of the remaining vanes is defined in the balanced position. In said balanced position the vanes are essentially parallel to the fluid flow and do not cause any significant pressure drop or deflection of the flow.

In an embodiment of the invention the valve is provided with a base plane that in the practical application of the valve is vertically oriented. The pivot axes of the vanes lie in a common plane that is generally transversal to the direction of fluid flow through the valve and that forms an acute angle with the base plane. In further practical embodiments of the invention the valve consists of a rectangular frame, the rear side of which defines said base plane; an upstanding rim is provided at an opposite side of the frame, an opposite pair of rim sections each having a row of openings formed therein for receiving pivots of the vanes; and the vanes have a flat, generally rectangular shape. With such a configuration the entire valve may be manufactured at a reasonable cost, and is specifically well suited for being manufactured from a plate material by punching and bending operations.

Another object of the invention is to provide an improved forced air-cooling system for use in an enclosure accommodating electronic equipment.

A further object of the invention is to provide an improved and very efficient fan unit, presenting a solution to the problem of avoiding excessive airflow impedance at the outlet thereof.

These and further objects of the invention are met by the invention as defined in the appended patent claims.

Advantages offered by the present invention, in addition to those described above, will be readily appreciated upon reading the below detailed description of embodiments of the invention.

BRIEF DESCRIPTION OF THE DRAWINGS

The invention, together with further objects and advantages thereof, may best be understood by making reference to the following description taken together with the accompanying drawings, in which:

FIG. 2B is a side view of the valve assembly illustrated in FIG. 1;

FIGS. 4A–B are a plan view from above and a side view, respectively of a vane of the valve assembly illustrated in FIGS. 1–3;

DETAILED DESCRIPTION OF EMBODIMENTS

Figure 1:
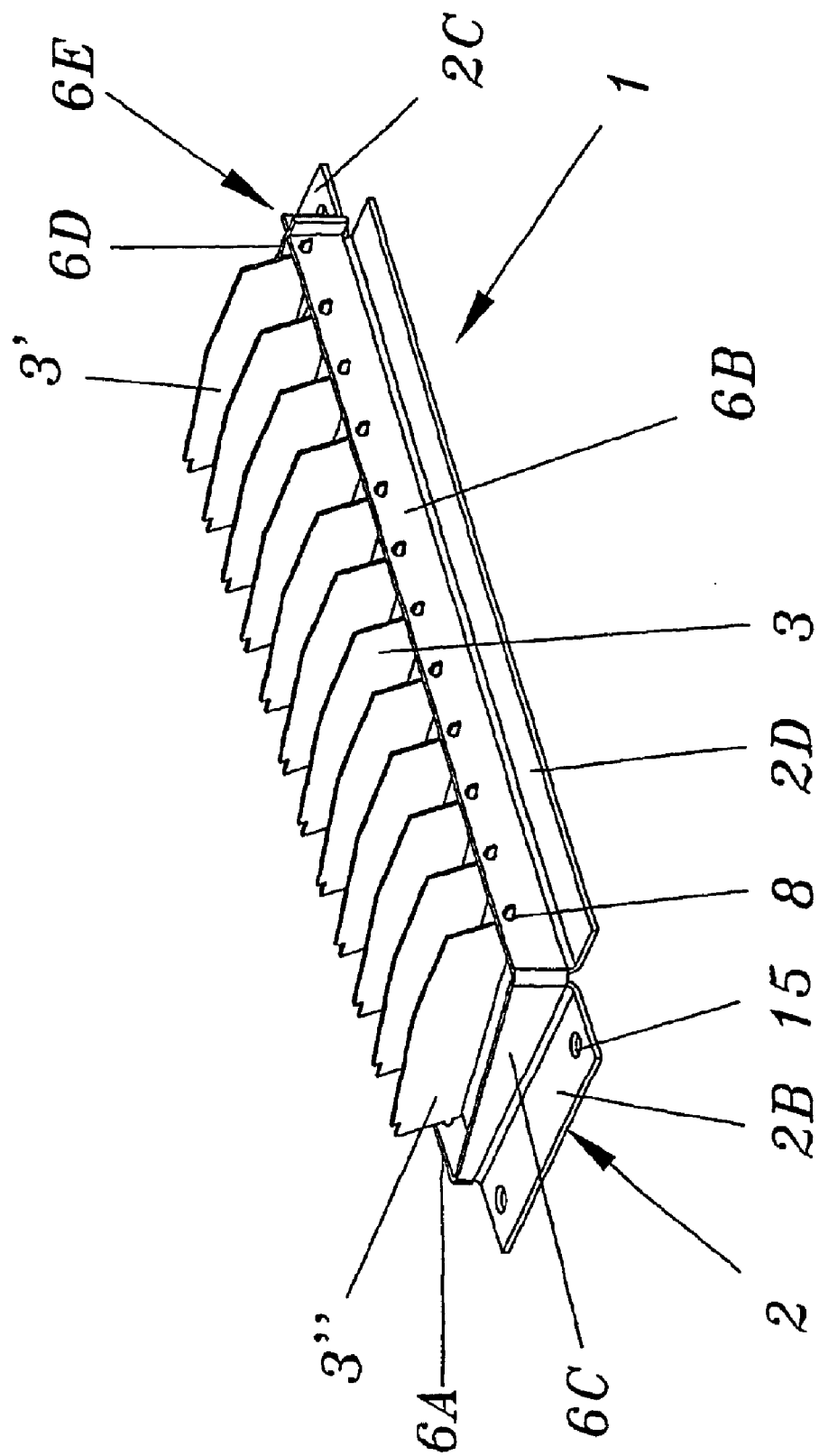
FIG. 1 is a perspective view of a first embodiment of a valve assembly according to the invention.

A first embodiment of the invention will now be described with specific reference to drawing FIGS. 1–6. Basically, the valve assembly 1 of the invention consists of a generally rectangular frame 2 in which a number of valve vanes 3, 3', 3" are pivotally supported, as is best illustrated in FIGS. 1 and 2B. Like in the conventional valves the vanes are pivotal about pivot axes A that are extended generally transversal to the general direction of flow AF (see FIG. 2B) through the valve. The frame 2 has flanges 2B–D likewise extending transversal to the general direction of flow AF and serving to support the valve 1 on a vertical wall 34 of a fan unit 30 casing 31, as will be described more closely below with reference to FIG. 10. For that purpose two of the flanges 2B, 2C are provided with bores 15 for fasteners 16 (see FIG. 10), such as bolts.

Figure 2A:
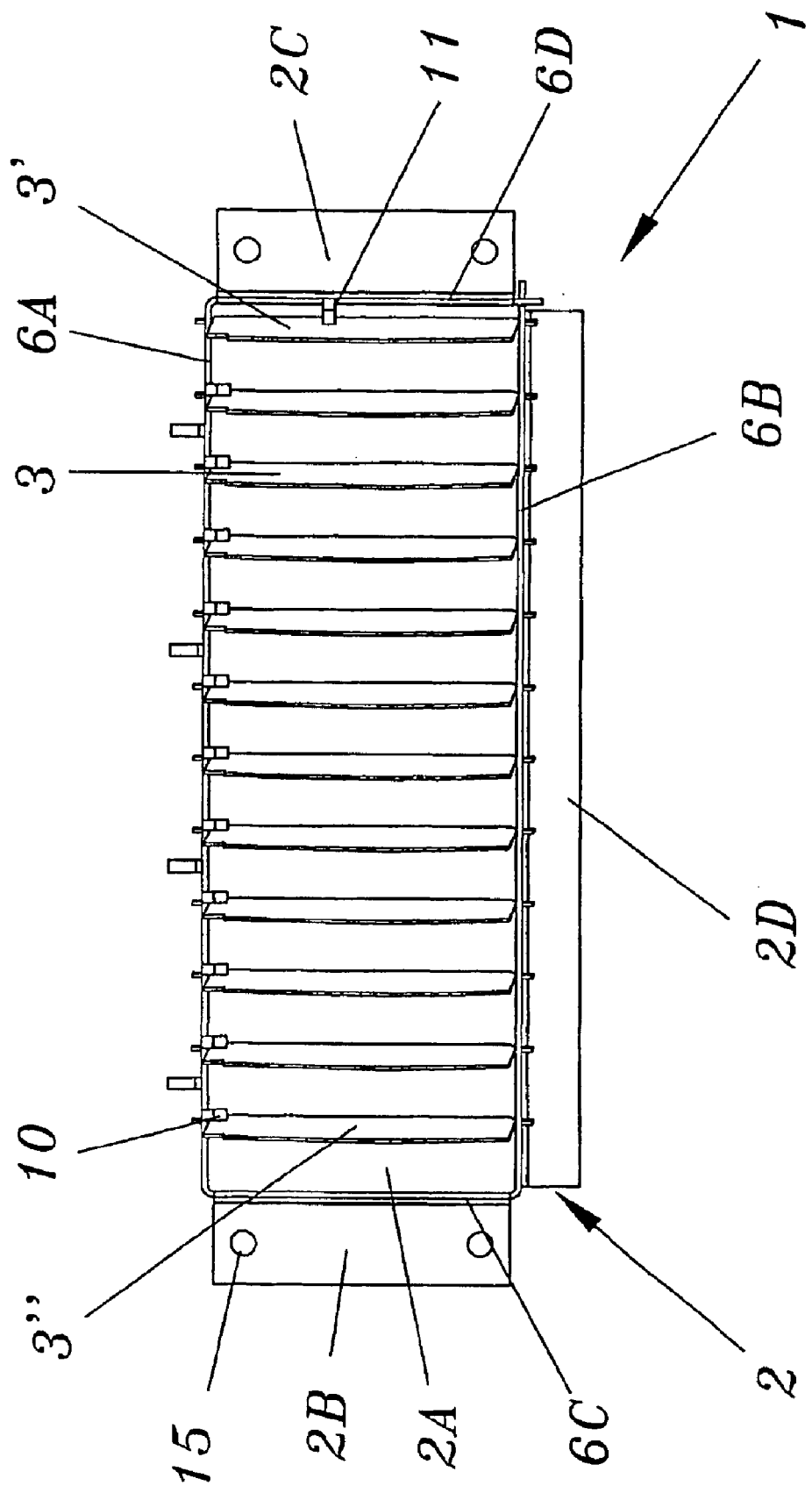
FIG. 2A is a top plan view of the valve assembly illustrated in FIG. 1.
Figure 2C:
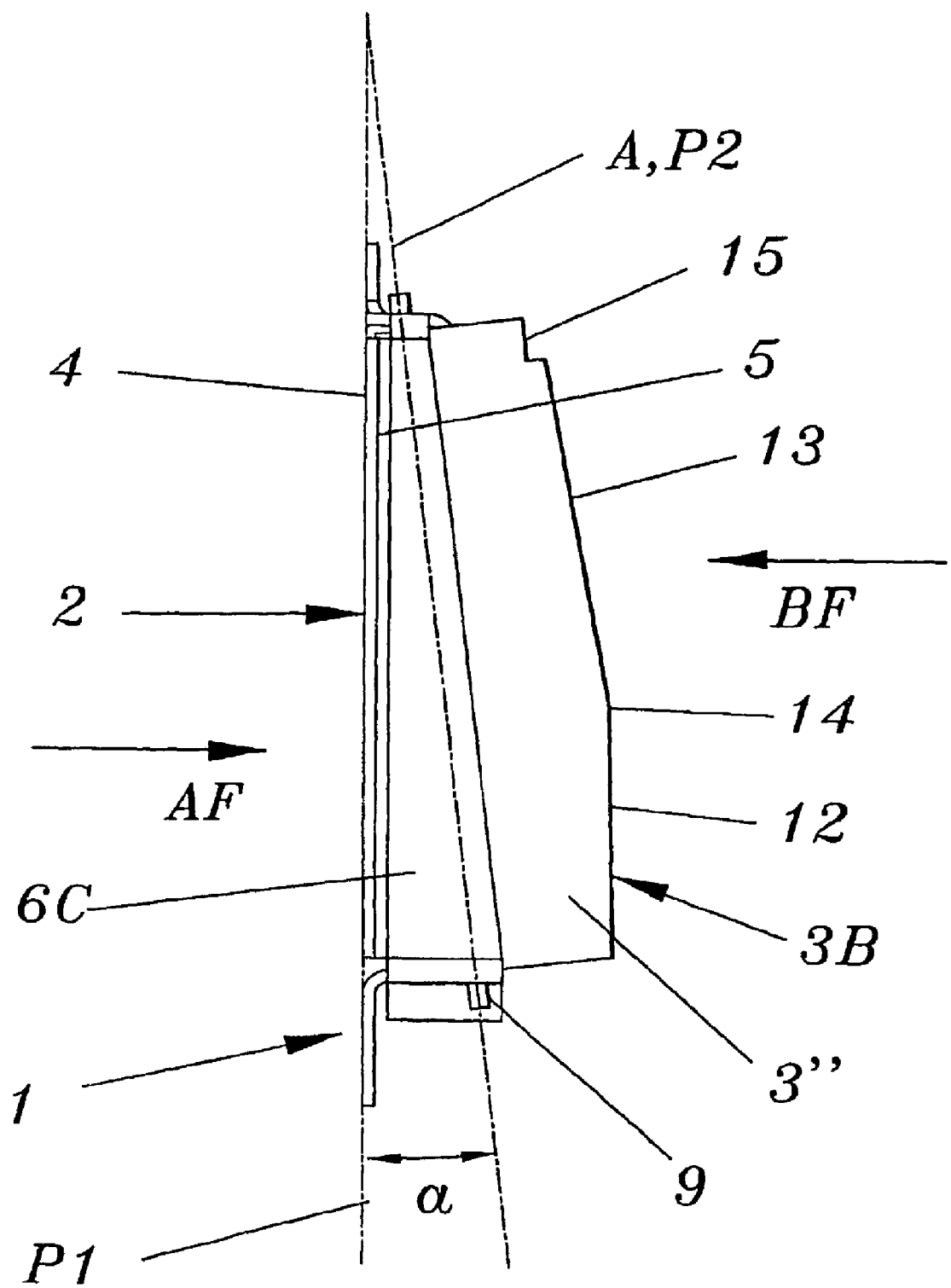
FIG. 2C is an end view of the valve assembly illustrated in FIG. 1.
Figure 3:
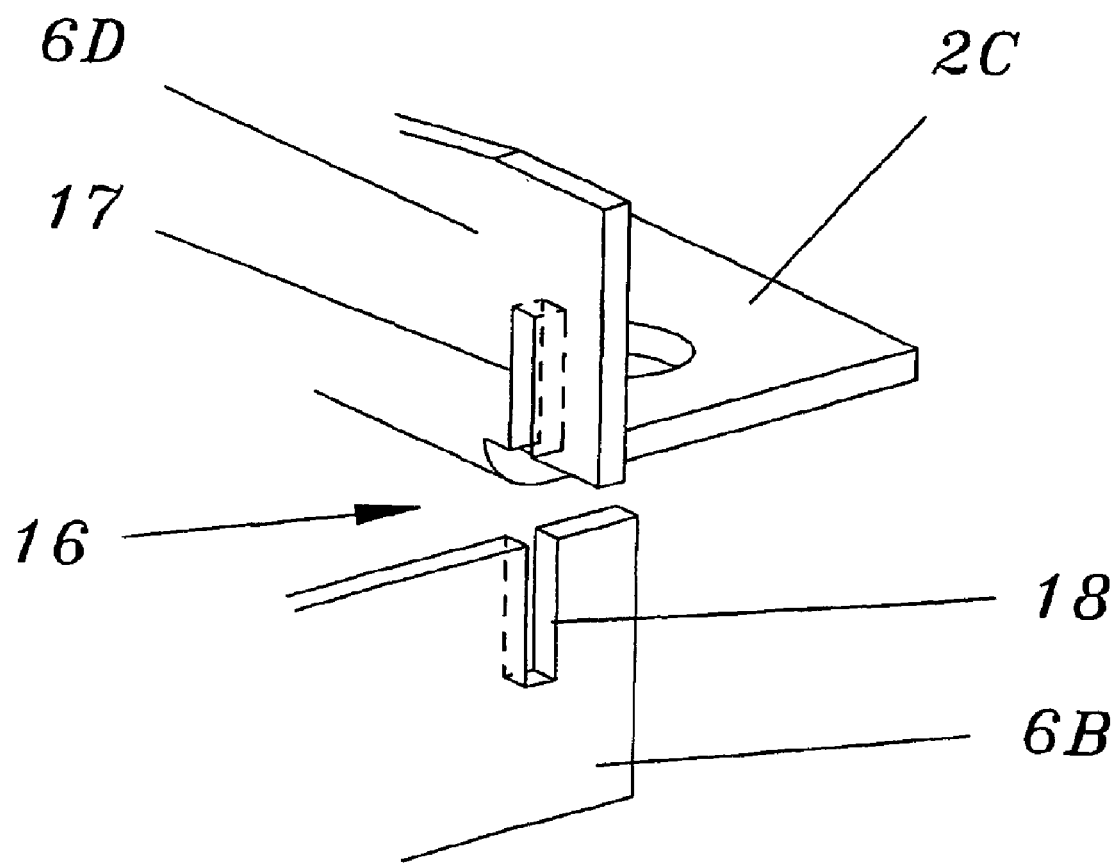
FIG. 3 is an enlarged partial perspective view of a valve flame joint of the valve assembly illustrated in FIG. 1.

The rear side 4 of the frame 2, in effect being the rear side of said flanges 2B–D, is flat and forms a base plane P1 of the valve 1. For the purpose of this description, the geometry of the valve will be explained with reference to said base plane P1 as well as to what is referred to as the general directions of allowed flow AF and blocked or obstructed flow BF, as is illustrated in FIG. 2C. Specifically, said general directions of flow AF and BF are regarded as being mutually opposite and perpendicular to the base plane. It shall be emphasized though, that said general directions of flow are theoretical and do not necessarily coincide with the actual flow during operation, said flow being normally more complex. Throughout this specification terms such as rear, back, backwards, front and forward and relating to the actual valve or its operation, are used to indicate positions and/or directions relative to said general direction of allowed flow AF.

The frame 2 has a central, likewise generally rectangular aperture 2A surrounded by a rim 6A–D. The rim consists of sections 6A–D extending from a front side 5 of the frame 2 and being normal to the base plane P1, thereby forming what may be referred to as a flow duct through the valve. In the illustrated embodiment where the frame 2 is manufactured from a punched and bent plate blank, see below, the rim sections 6B, 6D at the free ends of such a blank are joined by means of a mechanical joint 16, see FIG. 3. Said joint 16 is formed by means of complementary slits 17, 18 formed in the lower and upper edges, respectively of the rim sections 6D, 6B. In applications where this is regarded to be appropriate, the joint may be secured by means of adhesive, welding or any other suitable means. Each one of the opposite rim sections 6A, 6B that extend along one of the long sides of the rectangular aperture 2A is provided with a row of evenly distributed bores 7, 8. Each such row consists of twelve bores 7, 8 that serve the purpose of receiving pivots 9 of the twelve valve vanes 3, 3', 3" that are pivotally received within the aperture 2A, as will be described below.

All of the vanes 3, 3', 3" are formed having the same shape, illustrated in detail in FIGS. 4A–B. Specifically the vanes 3, 3', 3" have a flat generally rectangular shape with a first, rear straight long side 3A, an opposite, second forward long side 3B and first and second short sides 3C and 3D connecting the long sides. Adjacent said first long side 3A, each of the short sides 3C and 3D are formed having outwardly directed tabs 9 forming pivots for the vanes. In other words, the pivot axes of the vanes extend through the pivots, parallel to the first long side, displaced from the centre of gravity CG of the vanes. The center of gravity CG is illustrated in FIG. 4A in a very approximate position and without any effort of specifying the absolutely correct position.

The second forward long side 3B is formed of two portions 12 and 13 that are inclined relative to each other and meet in a point 14, forming an obtuse angle δ with each other. The purpose of said pointed shape is to reduce friction between two adjacent vanes as they engage during a closing movement, as will be discussed below. At the corner between the second side portion 13 and the associated short side 3C is formed a cut-out 15 that is provided in order to make way for a later described motion stop 10 during pivoting of the vanes between open and closed positions OP and CP, respectively.

The pivots 9 of the vanes 3, 3', 3" are received in the bores 7, 8 of the rim sections 6A, 6B with sufficient play to secure free pivoting of the vanes 3, 3', 3" during operation. Of said two longer rim sections 6A, 6B one, 6B, is wider in the flow direction AF than the other, 6A, and the row of bores 8 thereof is positioned further from the flat rear side 4 of the frame 2 and thus further from the base plane P1. This means that in the assembled condition of the valve 1 the vanes 3, 3', 3" and their pivot axes A (see especially FIG. 4A) are tilted against the general direction of allowed flow AF through the valve. Expressed otherwise said pivot axes A are all equally inclined backwards relative to the base plane P1 so that they lie in a plane P2 that is perpendicular to the flow direction AF and that intersects said base plane 1 at an acute angle α. The purpose of this configuration will be explained further below.

Figure 5:
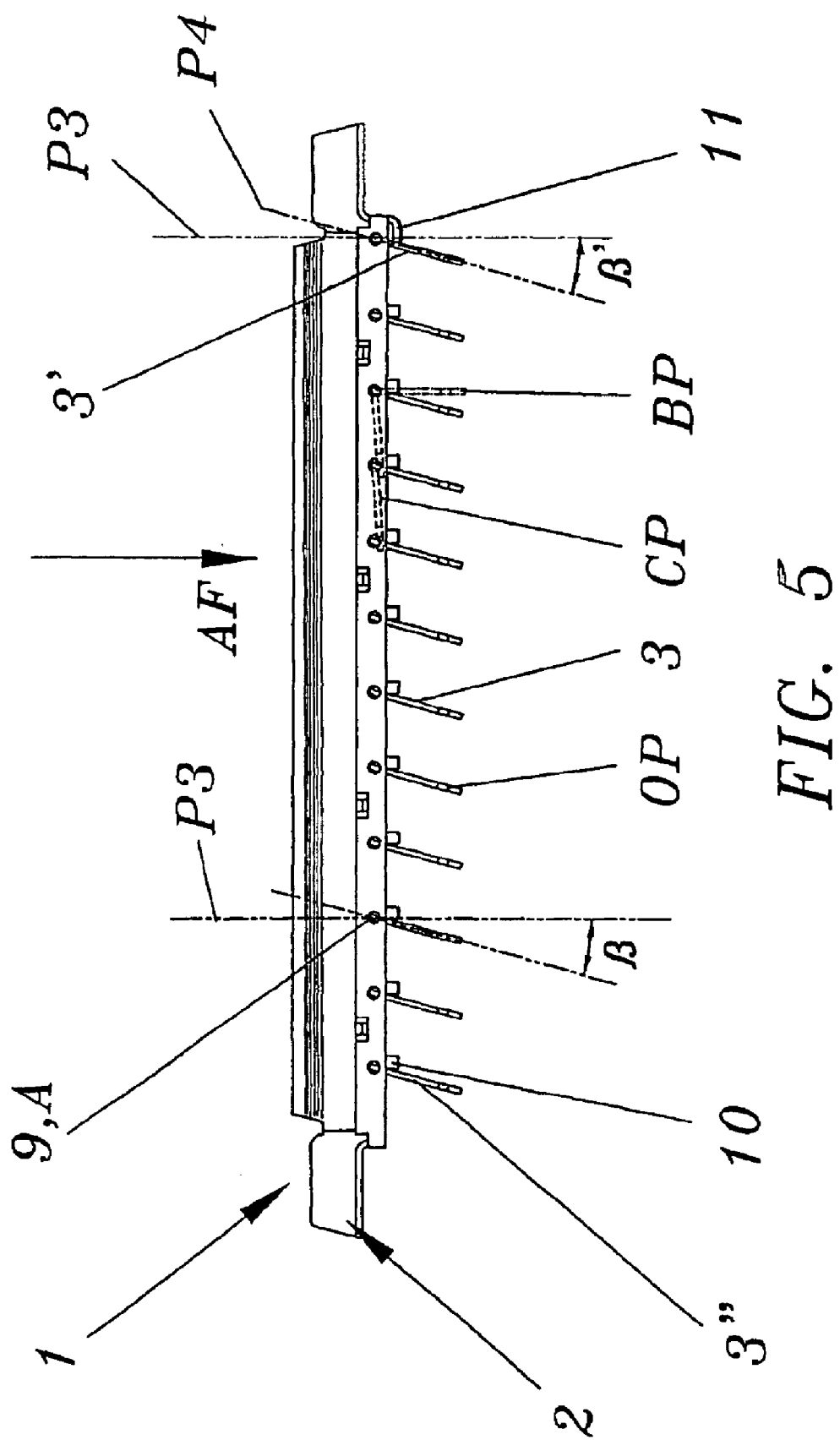
FIG. 5 illustrates the orientation of the vanes of the valve assembly of FIGS. 1–2C, in a view similar to that of FIG. 2B.

With the above described configuration according to the invention each vane 3, 3', 3", has a theoretical balanced position BP, see FIGS. 2B and 5, in which it is essentially balanced with regard to the force of gravity. In effect, in the balanced position the pivot axis A as well as the centre of gravity CG of each vane lie in the same vertical plane P3 that is parallel to the general direction of fluid flow AF. This plane P3 is indicated in FIG. 5, which illustrates the valve 1 seen in a top view in the direction of the pivot axes A of the vanes 3, 3', 3", with the pivot axes being normal to the paper space. This facilitates both the illustration and the explanation of the mutual positions of the vanes.

In other words, in the absence of fluid flow through or pressure differential across the valve, no closing force acts upon the valve vanes in said balanced position BP that is reached when the vanes 3, 3', 3" are extended in said vertical plane P3. However, once outside said balanced position BP the vanes 3, 3', 3" are urged towards their closed position CP, see FIG. 6, under the force of gravity. Specifically, through the inclination of the pivot axes A and as they advance from the balanced position, the vanes are increasingly urged by gravity to pivot towards the closed position CP. Thus, the closing force is smallest in the open position, thereby reducing the resistance to flow and the pressure drop across the valve. On the other hand, the closing force is greatest in the actual closed position, thereby securing an effective closing of the valve 1.

Additionally, motion stops 10, 11 are provided at the front edge of the rim. In the illustrated embodiment the motion stops for all vanes 3, 3" except for a first vane 3', as seen in the direction of pivoting from the open position OP, are provided at the front edge of the wider, long rim section 6B. The motion stop 11 for said first vane 3' is provided at the front edge of the short rim section 6D positioned to the right in FIG. 2A. The purpose of the motion stops is to define an open position OP, see FIG. 2B, for the vanes, allowing full flow through the valve 1. Thus, the stops 10, 11 are provided in the path of the pivoting movement of the associated blade 3, 3', 3" from the closed position CP and establish the defined open position OP of said associated blade through engagement therewith. By providing such a defined open position the vanes will be maintained in a stable condition during fluid flow through the valve, eliminating any tendency of the vanes to oscillate or vibrate as a result of turbulence caused in the fluid flow.

Specifically, for each vane 3, 3', 3", the associated stop 10 or 11 is positioned to define said open position OP shortly before the balanced position BP, as seen in the direction of pivoting from the closed position CP. Thereby the vanes 3, 3', 3", in the open position are extended in a plane P4 (see FIG. 5) that forms a small angle β, β'>0 with the above mentioned plane P3 in which the pivot axis A lies. In this first embodiment, the motion stops 10, 11 are positioned so that all of the vanes are parallel in their open position OP. The closed position CP of the vanes 3, 3' is defined by their overlapping engagement with the adjacent vane 3, 3" in the area of the pivot axis A thereof. The closed position CP of the last vane 3", as seen in the direction of pivoting from the open position (OP), is established by its engagement with the left (as seen in FIG. 2A) short section 6C of the rim.

The separate blades 3, 3', 3" as well as an elongate frame blank are punched out from an appropriate plate material. The frame 2 as well as the blades 3, 3', 3" are preferably manufactured from steel plate, such as a low cost Alu-Zn coated steel. Although not specifically illustrated herein, it should be obvious that the flame blank has the flattened out shape of the frame shown in i.a FIGS. 1, 2A and 2C. In such punching operations, the blades are given their final shape in one step, whereas the punched frame blank has to be given its final shape in a bending operation. Specifically, the flanges 2B–2D are bent out at right angles to the rim 6A–D, whereupon the rim is bent to the rectangular shape. The valve 1 is then assembled by mounting the blades 3, 3', 3" with their pivots 9 inserted into the respective holes 7, 8 in the opposing rim sections 6A and 6B.

When all of the blades have been mounted in the frame, the free ends of the frame blank are joined by means of the mechanical joint 16 or other appropriate means.

Figure 6:
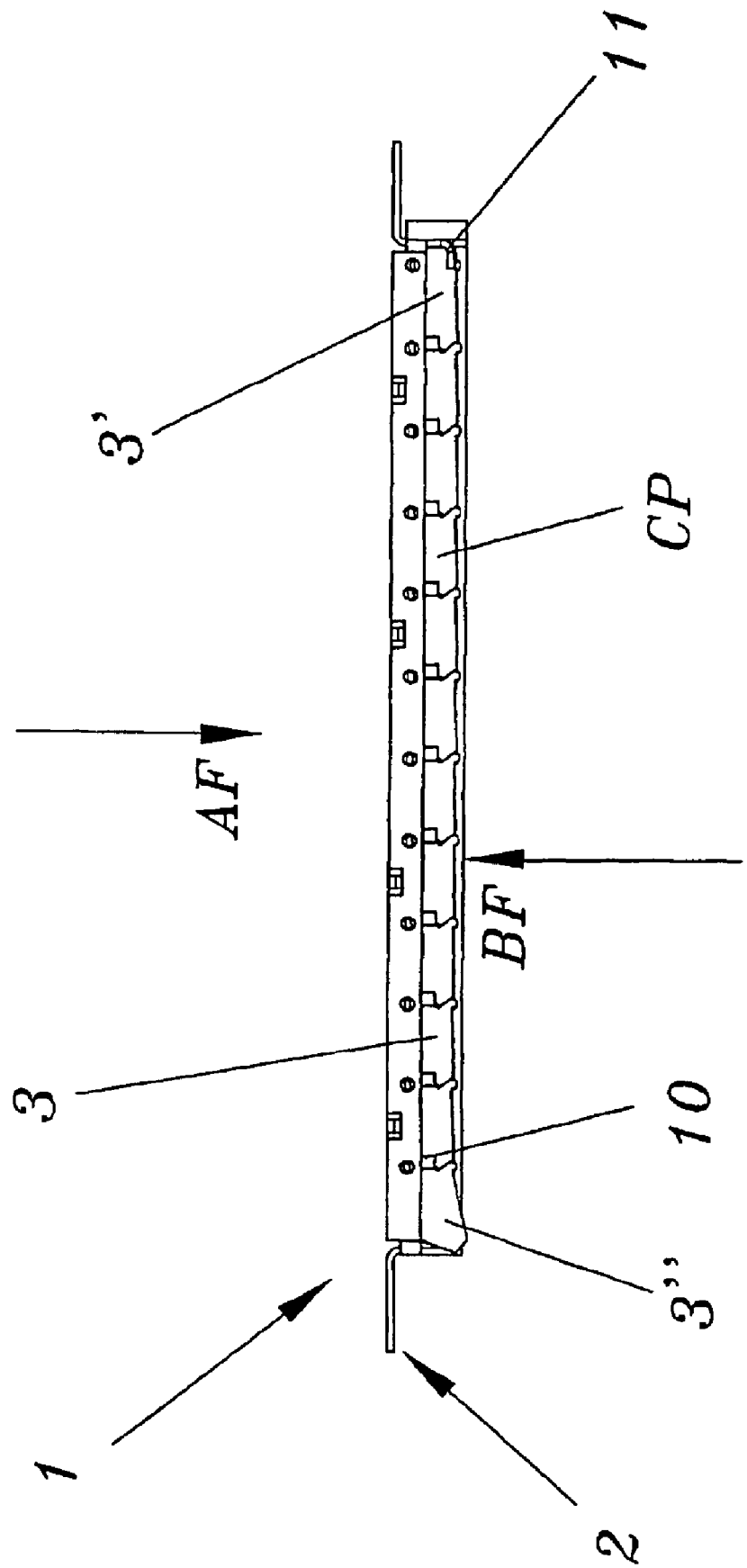
FIG. 6 is a view corresponding to that of FIG. 2B, but illustrating the orientation of the vanes of the valve assembly in a closed position.

The operation of the valve assembly 1 will now be described with specific reference to FIGS. 2B, 2C, 5 and 6. As mentioned above, the valve 1 is illustrated in FIG. 5, as well as in the below discussed FIGS. 7 and 8, in a top side view with the pivot axes A of the vanes 3, 3', 3" being normal to the paper space. In use, the valve 1 is attached to a vertical surface, such as the wall 34. Accordingly, the base plane P1 will also be vertical so that the pivot axes A of the vanes form the above described angle α also with the vertical. In the inoperative condition, with no fluid flow present, the valve is shut by the vanes 3, 3', and 3" that are all in their closed position CP, as illustrated in FIG. 6. In this position the vanes block flow in the direction BF by overlapping the adjacent vane in the area of the pivot axis thereof, except for the last vane that engages the rim.

As fluid starts to flow in the flow direction AF all of the vanes are pivoted by the fluid flow towards their open positions OP illustrated in FIGS. 2B and 5, until halted by the motion stops 10, 11 in the open position. As described above, the vanes in this position present very little resistance to flow since they are halted only a small distance away from the balanced position.

In case the fluid flow through the valve ceases, for instance due to fan failure, the vanes will immediately start to pivot from the open position OP by the combination of the inclined orientation of the pivot axes A and of the orientation of the vanes in the small angle β, β' relative to the balanced position BP. Specifically, under the influence of gravity, often supported by a pressure differential, the vanes are pivoted from the open position OP towards the closed position CP by a force that increases with the distance from the balanced position BP. In the described manner a valve is designed that combines the advantageous and desired features of presenting only a very limited resistance to flow therethrough and of securing an automatic fast and reliable operation to the closed blocking position. In both pivoting directions the cutouts 15 in the vanes 3, 3', 3" provide room for the vanes to pass the stops 10 for the following vane.

In an example of the above discussed first embodiment the angle α of inclination of the pivot axes A was chosen to be approximately 7° and the open position angle β, β' was chosen to be approximately 16°. Tests have proven that the valve operates satisfactorily with such a configuration, but it should be emphasized that within reasonable limits said angles may be chosen optionally in order to tailor the characteristics of the valve for any specific application. Therefore, it lies within the scope of the invention to modify said angles for any specific application.

Figure 7:
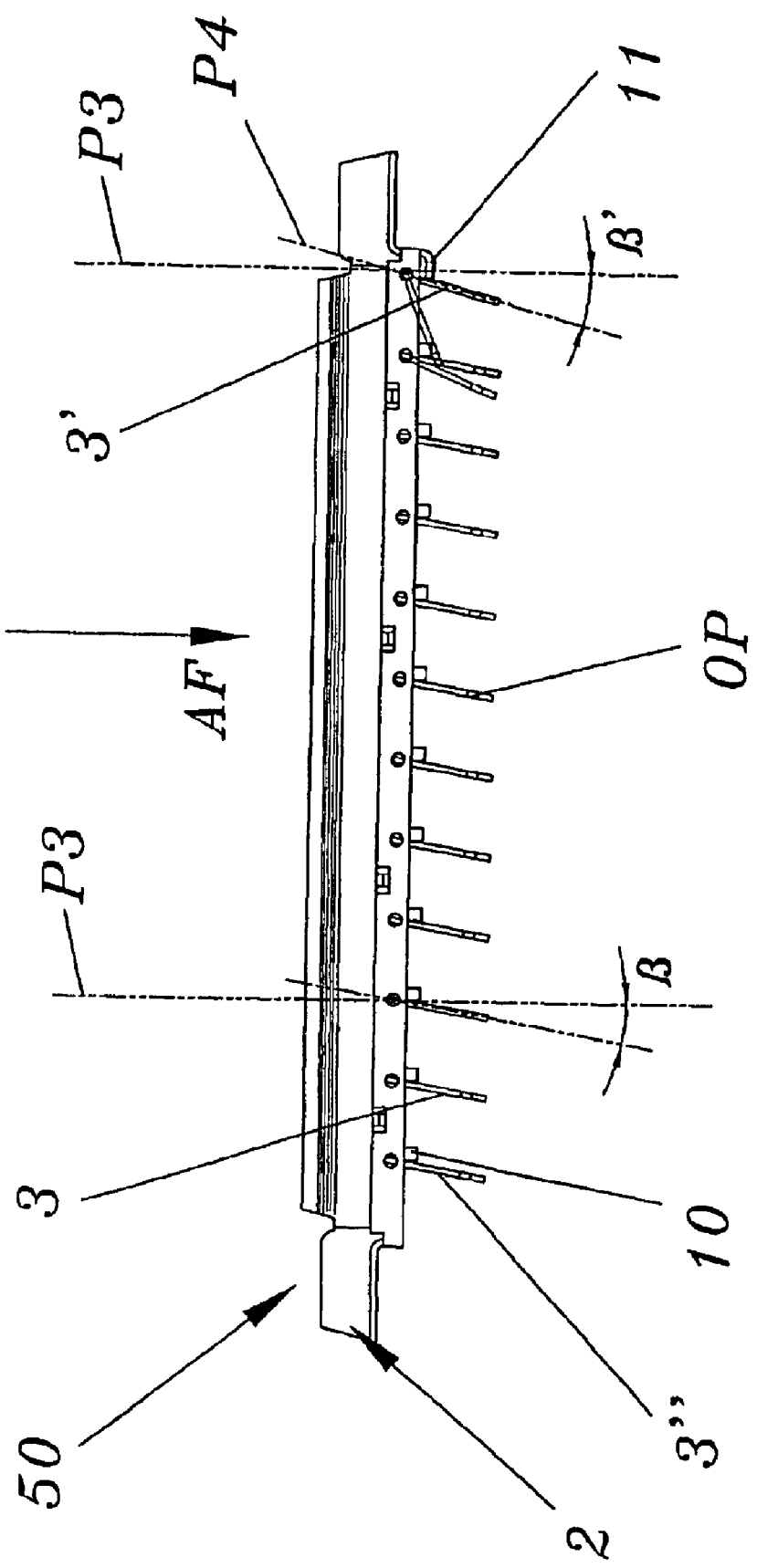
FIG. 7 illustrates the orientation of the vanes of a second embodiment of the valve assembly of the invention, in a view corresponding to that of FIG. 5.
Figure 8:
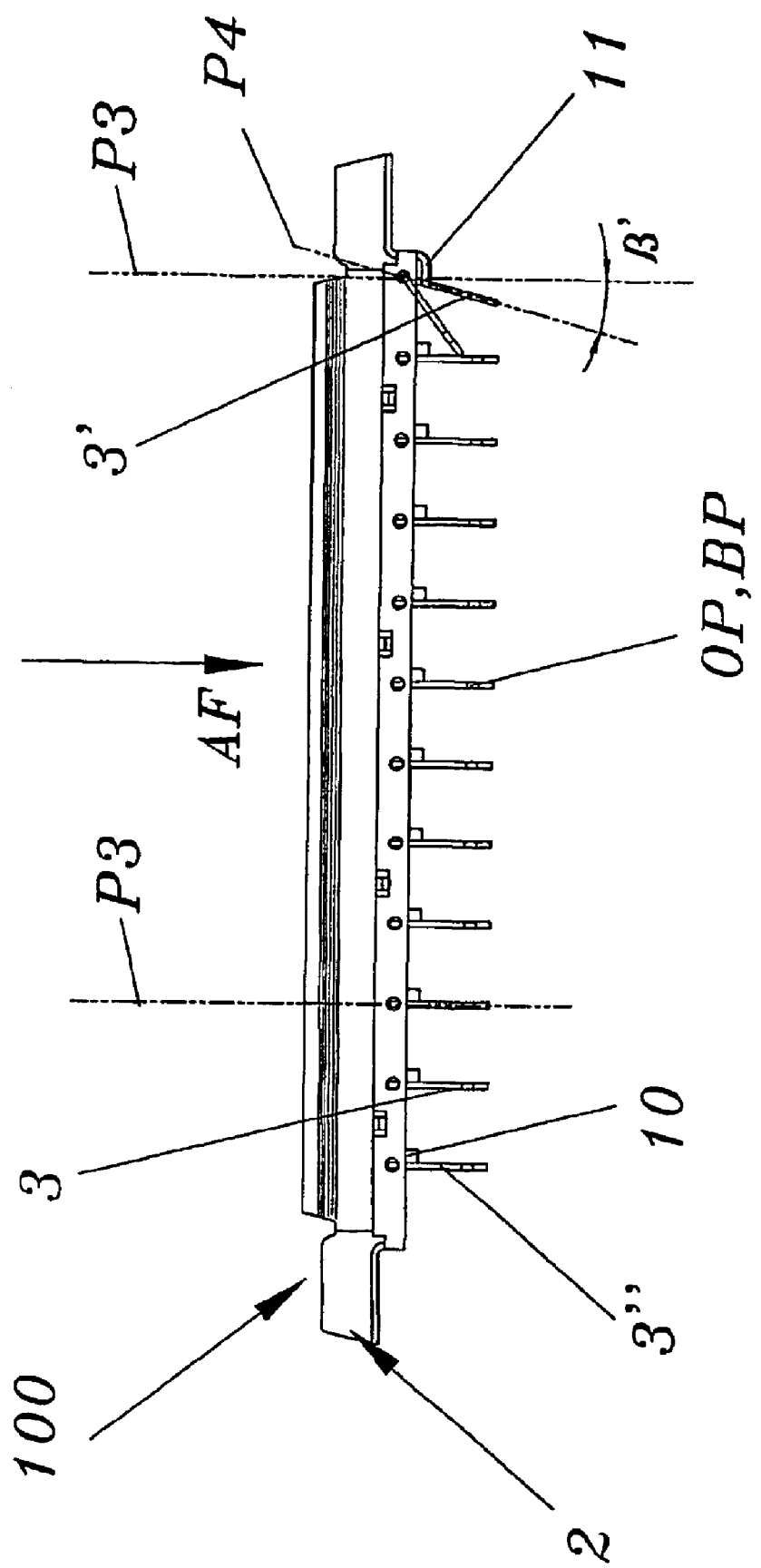
FIG. 8 illustrates the orientation of the vanes of a third embodiment of the valve assembly of the invention, in a view corresponding to that of FIG. 5.

Modified, second and third embodiments of the inventive valve assembly 50, 100 will now be described with reference to FIGS. 7 and 8 that show said embodiments in views corresponding to that of FIG. 5 in order to specifically illustrate the open position angles β, β' of the vanes 3, 3', 3". The valves 50, 100 of FIGS. 7 and 8 are identical to that of the first embodiment, except for the orientation of the vanes in the open position OP. Regarding the different parts of the valves 50, 100 bearing the same reference numerals as in the first embodiment, reference is made to the above description thereof.

In the second embodiment of FIG. 7 the open position angle β' of the first vane 3' is chosen to be the same as the angles β, β' of the first embodiment, i.e. approximately 16°. On the other hand, the open position angle β of the remaining vanes 3, 3" is chosen to be significantly smaller, in the illustration approximately 10°. Choosing this smaller angle of the vanes even further reduces their resistance to flow. With all vanes oriented under such a small angle, the distinct closing action of the valve 50 might be deteriorated. However, by orienting the first vane 3' under a larger angle β' a specific closing action will be achieved, that may be referred to as the "domino-effect". Specifically, as flow through the valve 50 is interrupted, a significantly larger closing force will act upon the first vane 3' than on the remaining vanes 3, 3". This will cause the first vane 3' to pivot in the closing direction before the other vanes 3, 3", and to hit the adjacent vane 3 with the point 14 of its second long side 3B and to thereby initiate closing of said second vane, as is indicated with dash-dot lines in FIG. 7. With the point contact between the vanes, the friction therebetween will be low and said "domino-effect" may continue throughout the vanes, with a preceding vane initializing the closing movement of a subsequent vane. In this manner, the resistance to flow may be reduced while the secure operation of the valve is maintained.

In FIG. 8 is disclosed a further variant of a valve 100 using the "domino-effect". In this case the resistance to flow is more or less eliminated by orienting all of the vanes 3, 3" except the first 3' so that the open position angle thereof is β=0° and the open position OP thereof coincides with the balanced position BP. By maintaining the first vane 3' in an angular orientation, with β'>0°, with regard to the balanced position BP, the "domino-effect" will also in this case secure closing of all vanes and thereby of the valve 100. Such an embodiment will be used in applications where it is vital to minimize the resistance to flow in the open position of the valve.

Figure 9:
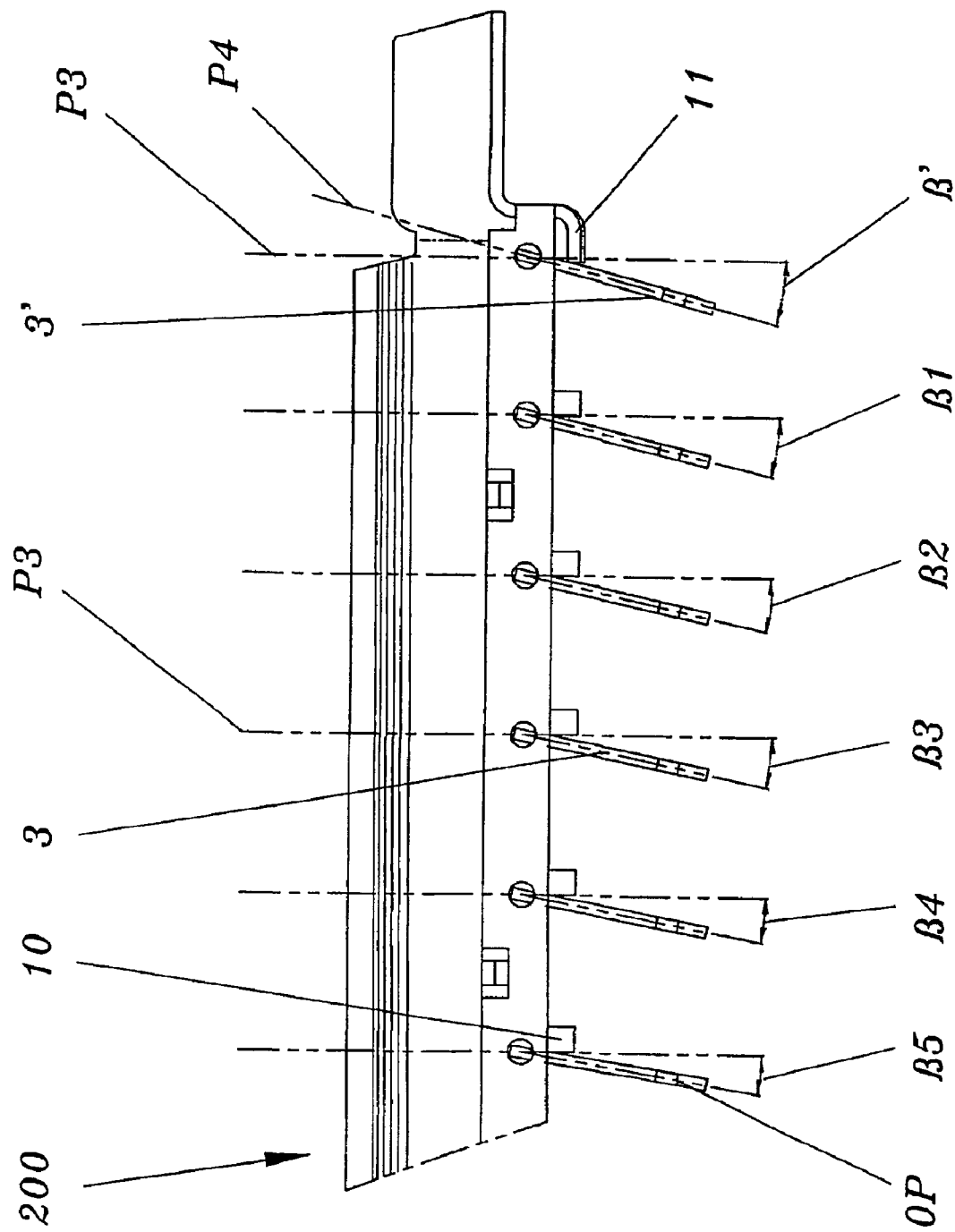
FIG. 9 is a partial top plan view of a fourth embodiment of the valve assembly according to the invention.

FIG. 9 illustrates a further variant of the valve 200, where the open position angle is different for all vanes of the valve, although only the first six are illustrated. This variant is specifically intended for applications that employ the above discussed "domino-effect", where it will serve the purposes of optimizing the closing of the valve and of minimizing vibration or oscillation of the vanes in their open positions.

In the illustrated exemplifying embodiment the open position angle of the vanes decreases with 1° for each vane, counted from the first vane 3'. In other words, the open position angle of the first valve vane 3' is $\beta'=15°$, the angle of the second vane 3 is $\beta 1=14°$, the angle of the third vane 3 is $\beta 2=13°$ etc. Although, in the illustrated embodiment, the open position angle $\beta'$, $\beta 1$, $\beta 2$, $\beta 3$, $\beta 4$, $\beta 5$ etc. decreases in equal steps of 1° between the successive vanes, it should be emphasized that in practical applications the difference in the open position angle between such successive vanes may be other than the illustrated 1° and may also vary from vane to vane.

Exemplifying such variations, the difference in the open position angle might be 2° between the first and the second valve vanes 3', 3 and 1° between all of the remaining valve vanes; or the difference in the open position angle might be 0.5° between each of the successive vanes. In any case, the open position angle of the first vane 3' shall be larger than the corresponding angle of any of the remaining vanes 3, 3".

Figure 10:
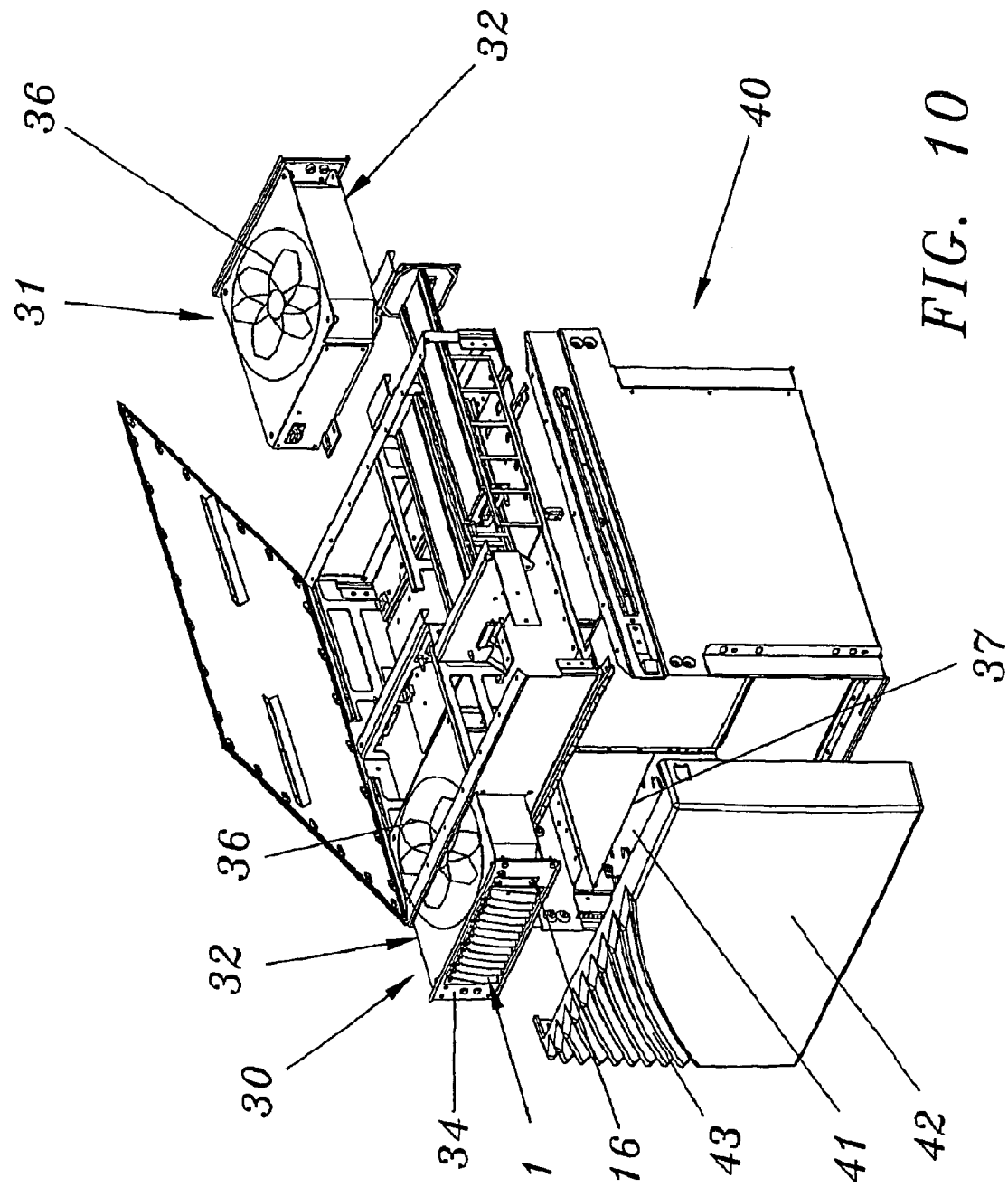
FIG. 10 is a perspective view of an application of the assembly according to the invention in an air cooling system for an electronic component enclosure.

Finally, FIG. 10 illustrates a presently preferred application of the valve 1 of the invention in a forced air cooling system for an enclosure 40, such as a cabinet for use within the telecommunications field. The enclosure 40 contains heat-generating components, as exemplified by a schematically indicated PCB 37 in FIG. 10, received in a component space 41 of the enclosure. As was described in the introduction such electronic components 37 generate heat that has to be removed in order to secure proper operation of the equipment. To this end, a forced air cooling system is provided in the enclosure 40. In order to provide redundancy with regard to said cooling system, it contains a number of, in the illustrated embodiment two, fan units 30, 31 that are provided in the upper area of the enclosure 40.

The fan units 30, 31 each consists of a fan 36, only schematically illustrated in FIG. 10, that is accommodated in a fan casing 32. In operation the fans 36 draw heated air from the component space 41 through an inlet opening, not specifically illustrated, of the casing 32 and into a likewise not specifically illustrated inlet end thereof. The heated and removed air is exhausted in a horizontal direction from an outlet end, not illustrated, of the fans 36, through an outlet opening 34 of the casing 32 and finally into the ambient air through a grid 43 in an enclosure cover 42. The outlet opening 34 of each fan unit casing 32 is completely covered by a valve assembly 1 of the invention, although only illustrated for one of the fan units 30, 31 of FIG. 10. It will now be understood that in the event that one of the fans 36 fails the associated check valve 1 will immediately close in the manner described above, thereby securing that air is not drawn backwards therethrough by the still operating fan 36. Such back-flow would otherwise significantly reduce the amount of air drawn from the component space 41 by the still operating fan 36 and would quickly cause said space 41 to become overheated.

The invention has been described above with specific reference to the illustrated embodiments thereof that are intended for use in a forced air cooling system for ventilating an enclosure containing heat generating components. However, it shall be understood that the invention is not restricted to these exemplifying embodiments or to such an application. The basic principles of the invention may likewise be applied to other embodiments for use in other fields, such as for general ventilation purposes. Therefore, modifications and variations of the invention that may be required in such applications fall within the scope of the invention. As an example of such modifications of the valve that fall within the scope of the invention, all of the motion stops 10, 11 may be provided at the wider long section 6B of the rim of the frame 2. Although the identical shape of the vanes is very favorable with regard to a rational manufacturing, it likewise falls within the scope of the invention to employ a rectangular last vane 3" lacking the pointed configuration at its free long side. In such an embodiment, the last vane may optionally still engage the rim in its closed position. Alternatively, a separate closed position motion stop, not illustrated, may be provided in the aperture 2A, below the free edge of the rim section 6D. Such separate closed position motion stops may also be provided for all vanes of the valve, especially in an embodiment having narrower vanes that do not overlap in a closed position. All of the vanes may therefore likewise be formed with such a straight free long side being parallel to the pivot axis side 3A and optionally overlapping the adjacent vane or not, when in the closed position.

It will be understood by those skilled in the art that various modifications and changes may be made to the present invention without departure from the scope thereof, which is defined by the appended claims.

What is claimed is:

1. A check valve for preventing back-flow of fluid, comprising:
   a frame;
   a plurality of adjacent parallel pivot axes mounted in the frame; and
   a plurality of adjacent vanes, each of the vanes being pivotally mounted to an associated one of the parallel pivot axes, and pivoting between an open position and a closed position;
   wherein the pivot axes extend generally transverse to the direction of fluid flow through the valve, and each pivot axis is offset from the center of gravity of its associated vane so that fluid flowing through the valve in an allowed direction moves the vanes toward the open position, and fluid flowing in a blocked direction moves the vanes toward the closed position; and
   wherein the pivot axes are inclined at an angle ($\alpha$) measured from a vertical reference, thereby causing vanes that are in at least a partially open position to be urged by gravity to pivot towards the closed position.

2. The check valve of claim 1, further comprising a plurality of motion stops, each motion stop being mounted in a pivoting path of an associated vane and defining the open position of the associated vane through engagement therewith.

3. The check valve of claim 2, wherein the motion stops define the open position of each vane so that a small angle ($\beta$) is formed between the general direction of fluid flow and the plane of each vane.

4. The check valve of claim 3, wherein the motion stops define the same small angle ($\beta$) for each of the vanes in the open position.

5. The check valve of claim 3, wherein the motion stop for a first vane is positioned such that in the open position, the first vane forms an angle ($\beta'$) with the general direction of fluid flow that is larger than the angle ($\beta$) formed by the other vanes.

6. The check valve of claim 2, wherein the motion stops for the vanes are positioned such that in their open positions, the vanes form a small angle with the general direction of fluid flow that decreases for each successive vane.

7. The check valve of claim 2, wherein the motion stops define the open position of each vane except a first vane so that all of the vanes except the first vane are parallel to the general direction of fluid flow, and the open position of all of the vanes except the first vane coincides with a balanced position in which the vanes are essentially balanced with regard to the force of gravity.

8. The check valve of claim 7, wherein the motion stop for the first vane define the open position of the first vane so that a small angle ($\beta$>0) is formed between the general direction of fluid flow and the plane of the first vane.

9. The check valve of claim 1, wherein the frame is a generally rectangular frame having a flat rear surface forming a base plane of the valve, said frame being adapted for attachment to a vertical surface for receiving a substantially horizontal flow through the valve and a generally rectangular aperture in the vertical surface.

10. The check valve of claim 9, wherein the frame includes a front surface opposite the rear surface of the frame, said front surface having a rim surrounding the aperture and extending approximately normal to the rear surface and the base plane, said rim having a row of openings on opposite sides of the aperture for rotatably receiving opposite ends of the pivot axes.

11. The check valve of claim 1, wherein the vanes have a generally rectangular flat shape having two short sides and two long sides, and each of the vanes is pivotally mounted to an associated one of the parallel pivot axes along a first long side of the vane.

12. The check valve of claim 11, wherein the short sides of the vane have a length that causes each of the vanes except a last vane to overlap an adjacent vane when in the closed position.

13. The check valve of claim 11, wherein a second long side of each vane is formed by two side edge portions that meet in an outwardly directed point forming an obtuse angle.

14. A forced air cooling system for an enclosure accommodating heat producing electronic components, comprising:
   a plurality of fan units mounted the enclosure, each of the fan units having a casing provided with an air outlet opening, and containing a fan that draws heated air from a component space of the enclosure and exhausts the air drawn from the component space in an essentially horizontal direction from the outlet opening into the ambient air; and
   a check valve assembly covering each of the outlet openings of the fan units for allowing the flow of air out of the component space while blocking backflow of air through the outlet openings in the event that the associated fan fails, each of the check valve assemblies including a plurality of adjacent vanes, each of the vanes being pivotally mounted to an associated parallel pivot axis, and pivoting between an open position and a closed position;
   wherein the pivot axes extend generally transverse to the direction of airflow through the valve, and each pivot axis is offset from the center of gravity of its associated vane so that air flowing out of the component space moves the vanes toward the open position, and air attempting to flow into the component space moves the vanes toward the closed position; and
   wherein the pivot axes are inclined at an angle ($\alpha$) measured from a vertical reference, thereby causing vanes that are in at least a partially open position to be urged by gravity to pivot towards the closed position.

15. The forced air cooling system of claim 14, wherein the check valve assembly includes a plurality of motion stops, each motion stop being mounted in a pivoting path of an associated vane and defining the open position of the associated vane through engagement therewith.

16. The forced air cooling system of claim 15, wherein the motion stops define the open position of each vane so that a small angle ($\beta$) is formed between the general direction of fluid flow and the plane of each vane.

17. The forced air cooling system of claim 16, wherein the motion stops define the same small angle ($\beta$) for each of the vanes in the open position.

18. The forced air cooling system of claim 16, wherein the motion stop for a first vane is positioned such that in the open position, the first vane forms an angle ($\beta'$) with the general direction of fluid flow that is larger than the angle ($\beta$) formed by the other vanes.

19. The forced air cooling system of claim 15, wherein the motion stops for the vanes are positioned such that in their open positions, the vanes form a small angle with the general direction of fluid flow that decreases for each successive vane, starting from a first vane.

20. The forced air cooling system of claim 14, wherein the motion stops define the open position of each vane except a first vane so that all of the vanes except the first vane are parallel to the general direction of fluid flow, and the open position of all of the vanes except the first vane coincides with a balanced position in which the vanes are essentially balanced with regard to the force of gravity.

21. A fan unit for use in a forced air cooling system serving to remove heat from a space of an enclosure accommodating heat producing components, said fan unit comprising:
   a casing provided with an air outlet opening;
   a fan supported in the casing that draws heated air from the enclosure and exhausts the air drawn from the enclosure in an essentially horizontal direction from the outlet opening into the ambient air; and
   a check valve assembly covering the outlet opening of the fan unit for allowing the flow of air out of the enclosure while blocking backflow of air through the outlet opening in the event that the fan fails, the check valve assembly having a plurality of adjacent vanes, each of the vanes being pivotally mounted to an associated parallel pivot axis that extends generally transverse to the direction of airflow through the valve, said vanes pivoting between an open position and a closed position;
   wherein each pivot axis is offset from the center of gravity of its associated vane so that air flowing out of the component space moves the vanes toward the open position, and air attempting to flow into the component space moves the vanes toward the closed position; and
   wherein the pivot axes are inclined at an angle ($\alpha$) measured from a vertical reference, thereby causing vanes that are in at least a partially open position to be urged by gravity to pivot towards the closed position.

22. The fan unit of claim 21, wherein the check valve assembly includes a plurality of motion stops, each motion stop being mounted in a pivoting path of an associated vane and defining the open position of the associated vane through engagement therewith.

23. The fan unit of claim 22, wherein the motion stops define the open position of each vane so that a small angle ($\beta$) is formed between the general direction of fluid flow and the plane of each vane.

24. The fan unit of claim 23, wherein the motion stops define the same small angle ($\beta$) for each of the vanes in the open position.

25. The fan unit of claim 23, wherein the motion stop for a first vane is positioned such that in the open position, the first vane forms an angle ($\beta'$) with the general direction of fluid flow that is larger than the angle ($\beta$) formed by the other vanes.

26. The fan unit of claim 22, wherein the motion stops for the vanes are positioned such that in their open positions, the vanes form a small angle with the general direction of fluid flow that decreases for each successive vane, starting from a first vane.

27. The fan unit of claim 21, wherein the motion stops define the open position of each vane except a first vane so that all of the vanes except the first vane are parallel to the general direction of fluid flow, and the open position of all of the vanes except the first vane coincides with a balanced position in which the vanes are essentially balanced with regard to the force of gravity.

* * * * *